US011385708B2

(12) United States Patent
Chiang et al.

(10) Patent No.: US 11,385,708 B2
(45) Date of Patent: Jul. 12, 2022

(54) MEMORY DEVICES AND CONTROL METHODS THEREOF

(71) Applicant: Winbond Electronics Corp., Taichung (TW)

(72) Inventors: Ju-An Chiang, Hsinchu (TW); Shih-Chieh Chiu, Zhubei (TW)

(73) Assignee: WINBOND ELECTRONICS CORP., Taichung (TW)

( * ) Notice: Subject to any disclaimer, the term of this patent is extended or adjusted under 35 U.S.C. 154(b) by 559 days.

(21) Appl. No.: 16/395,616

(22) Filed: Apr. 26, 2019

(65) Prior Publication Data
US 2020/0057485 A1   Feb. 20, 2020

(30) Foreign Application Priority Data
Aug. 14, 2018   (TW) .................. 107128307

(51) Int. Cl.
  *G06F 1/3296* (2019.01)
  *G06F 1/28* (2006.01)
  *G06F 1/24* (2006.01)
  *G06F 1/3234* (2019.01)

(52) U.S. Cl.
  CPC .............. *G06F 1/3296* (2013.01); *G06F 1/24* (2013.01); *G06F 1/28* (2013.01); *G06F 1/3275* (2013.01)

(58) Field of Classification Search
  CPC ................. G06F 1/3296; G06F 1/24
  See application file for complete search history.

(56) References Cited

U.S. PATENT DOCUMENTS

| 6,850,453 B2 | 2/2005 | Park |
| 9,189,053 B2* | 11/2015 | Cui ........................ G06F 11/07 |
| 2016/0314836 A1* | 10/2016 | Pellizzer ............ G11C 13/0023 |
| 2017/0147362 A1* | 5/2017 | Froidevaux ........... G06F 1/3203 |

OTHER PUBLICATIONS

Wikipedia contributors. "System Management Mode." Wikipedia, Apr. 7, 2014, en.wikipedia.org/wiki/System_Management_Mode. Retrieved from https://web.archive.org/web/20140407224953/http://en.wikipedia.org/wiki/Voltage_regulator on Jul. 27, 2021 (Year: 2014).*

* cited by examiner

*Primary Examiner* — Kim Huynh
*Assistant Examiner* — Joshua Neveln
(74) *Attorney, Agent, or Firm* — Muncy, Geissler, Olds & Lowe, P.C.

(57) ABSTRACT

A memory device includes a power supply device, a power-on-reset device, a memory array, and a memory controller. The power supply device converts the external supply voltage into an internal supply voltage. When the external supply voltage exceeds a first threshold, the power-on-reset device generates a reset signal. The power-on-reset device further raises the first threshold to a second threshold according to a deep-sleep signal. The memory array is supplied with the internal supply voltage. The memory controller is supplied with the internal supply voltage, accesses the memory array, and is reset according to the reset signal. When the memory controller operates in a deep-sleep mode, the memory controller generates the deep-sleep mode.

11 Claims, 4 Drawing Sheets

MEMORY DEVICES AND CONTROL METHODS THEREOF

CROSS REFERENCE TO RELATED APPLICATIONS

This Application claims priority of Taiwan Patent Application No. 107128307, filed on Aug. 14, 2018, the entirety of which is incorporated by reference herein.

BACKGROUND OF THE INVENTION

Field of the Invention

The disclosure relates generally to memory devices and control methods thereof, and more particularly it relates to memory devices operated in a deep-sleep mode and control methods thereof.

Description of the Related Art

The demands on the performance and the standby time of mobile devices are continuously being raised, and yet performance and standby time are conflicting concepts. Therefore, the deep-sleep mode is derived to fulfill the requirements of both performance and standby time on mobile devices. A mobile device could consume less power during the deep-sleep mode, and also provide the best performance for the user during the standby mode.

BRIEF SUMMARY OF THE INVENTION

In an embodiment, a memory device comprises a power supply device, a power-on-reset device, a memory array, and a memory controller. The power supply device converts an external supply voltage into an internal supply voltage. The power-on-reset device generates a reset signal upon detecting that the external supply voltage exceeds a first threshold. The power-on-reset device raises the first threshold to a second threshold according to a deep-sleep signal. The memory array is supplied with the internal supply voltage. The memory controller is supplied with the internal supply voltage. The memory controller accesses the memory array, and is reset according to the reset signal. When the memory controller operates in a deep-sleep mode, the memory controller generates the deep-sleep signal.

According to an embodiment of the invention, the second threshold is a minimum operation voltage of the memory controller. The first threshold is less than the minimum operation voltage.

According to an embodiment of the invention, the power supply device comprises a power clamp. The power clamp lowers the external supply voltage by a voltage to reach the internal supply voltage.

According to an embodiment of the invention, the power clamp comprises a power switch and a unidirectional conducting device. The power switch provides the external supply voltage to a power node according to the deep-sleep signal. The unidirectional conducting device is coupled between the power node and the internal supply voltage and comprises a forward voltage. The difference between the external supply voltage and the internal supply voltage is equal to the forward voltage.

According to an embodiment of the invention, the power supply device comprises a regulator. The regulator converts the external supply voltage into the internal supply voltage according to a standby signal, and stabilizes the internal supply voltage. When the memory controller operates in a standby mode, the memory controller generates the standby signal.

According to an embodiment of the invention, the power-on-reset device comprises: a first switch, a first resistor, a second resistor, a third resistor, a second switch, and a hysteresis trigger. The first switch provides the external supply voltage to a first node according to an enable signal. The memory device is activated by the enable signal. The first resistor is coupled between the first node and the second node. The second resistor is coupled between the second node and a third node. The third resistor is coupled between the third node and a ground. The second switch couples the second node to the third node according to the deep-sleep signal. The hysteresis trigger generates the reset signal when a voltage of the third node is not less than a reset threshold.

According to an embodiment of the invention, when the memory controller operates in the deep-sleep mode, the second switch is turned OFF. When the memory controller operates in the standby mode, the second switch is turned ON.

In another embodiment, a control method for a memory device comprises determining whether the memory device is operating in a deep-sleep mode or a standby mode; when the memory device is operating in the standby mode, setting a reset threshold to be a first threshold; when the memory device is operating in the deep-sleep mode, setting the reset threshold to be a second threshold. The second threshold exceeds the first threshold. The control method further comprises determining whether an external supply voltage exceeds the reset threshold and when the external supply voltage exceeds the reset threshold, resetting the memory device. The second threshold is a minimum operation voltage of the memory device, and the first threshold is less than the minimum operation voltage.

According to an embodiment of the invention, when the memory device is operating in the deep-sleep mode, the control method further comprises converting the external supply voltage into the internal supply voltage using a unidirectional conducting device. A difference between the external supply voltage and the internal supply voltage is equal to a forward voltage of the unidirectional conducting device.

According to another embodiment of the invention, when the memory device is operating in the standby mode, the control method further comprises converting the external supply voltage into the internal supply voltage using a regulator, and stabilizing the internal supply voltage.

According to an embodiment of the invention, the regulator is a linear regulator.

According to another embodiment of the invention, the regulator is a nonlinear regulator.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
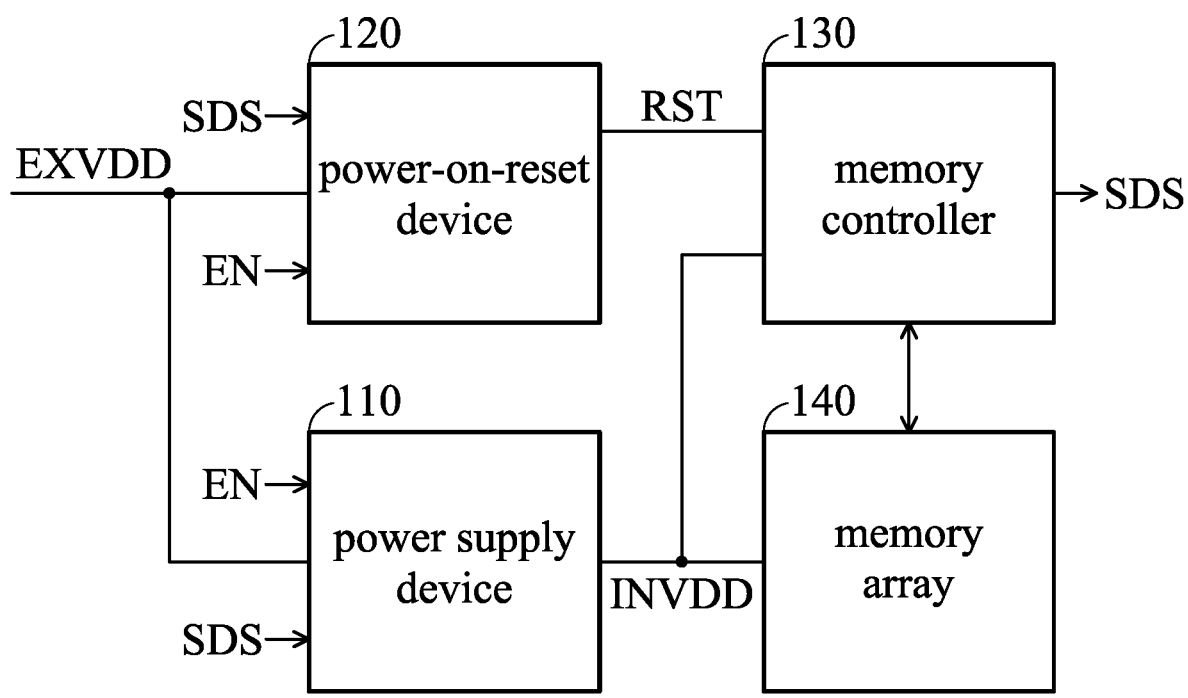
FIG. 1 is a block diagram of a memory device in accordance with an embodiment of the invention.

The FIG. 1 is a block diagram of a memory device in accordance with an embodiment of the invention. As shown in FIG. 1, the memory device 100 includes a power supply device 110, a power-on-reset device 120, a memory controller 130, and a memory array 140. The power supply device 110 receives an external supply voltage EXVDD and converts the external supply voltage EXVDD into an internal supply voltage INVDD according to an enable signal EN. According to an embodiment of the invention, the internal supply voltage INVDD is less than the external supply voltage EXVDD.

The power-on-reset device 120 is configured to detect the external supply voltage EXVDD according to the enable signal EN. According to an embodiment of the invention, when the external supply voltage EXVDD is gradually rising to exceed a reset threshold, the power-on-reset device 120 generates a reset signal RST. According to another embodiment of the invention, when the external supply voltage EXVDD is gradually decreased to be less than the reset threshold, the power-on-reset device 120 does not generate the reset signal RST. According to an embodiment of the invention, the memory device 100 is activated according to the enable signal EN.

The memory controller 130 and the memory array 140 are both supplied with the internal supply voltage INVDD. The memory controller 130 is configured to access the memory array 140, and the memory controller 130 is reset according to the reset signal RST. According to an embodiment of the invention, the internal logic states in the memory controller 130 are reset according to the rising edge of the reset signal RST, such that the memory controller 130 could operate functionally. According to another embodiment of the invention, the internal logic states in the memory controller 130 are reset according to the falling edge of the reset signal RST. According to other embodiments of the invention, the designer may choose that the reset is triggered by a rising edge or a falling edge.

The memory controller 130 operates in a standby mode or a deep-sleep mode. According to an embodiment of the invention, when the memory controller 130 operates in the standby mode, the memory device 100 plays the best performance and provides the best read/write speed and user experience for the user. According to another embodiment of the invention, when the memory controller 130 operates in the deep-sleep mode, the memory device 100 consumes less power so as to prolong the standby time.

When the memory controller 130 operates in the deep-sleep mode, the memory controller 130 generates a deep-sleep signal SDS. The power-on-reset device 120 raises the reset threshold according to the deep-sleep signal SDS. According to an embodiment of the invention, when the memory controller 130 operates in the standby mode, the reset threshold is the first threshold. When the memory controller 130 operates in the deep-sleep mode, the reset threshold is the second threshold, in which the second threshold exceeds the first threshold.

In other words, when the memory controller 130 operates in the deep-sleep mode and the external supply voltage EXVDD is gradually rising to exceed the second threshold, the power-on-reset device 120 generates the reset signal RST so that the memory controller 130 is reset according to the reset signal RST so as to correctly operate the memory array 140.

According to an embodiment of the invention, the second threshold is the minimum operation voltage of the memory controller 130, and the second threshold exceeds the first threshold. The external supply voltage EXVDD is unstable during deep-sleep mode such that the internal voltage INVDD is unstable, resulting in some unstable logic states in the memory controller 130.

Therefore, the first threshold is raised to the second threshold. When the external supply voltage EXVDD falls below the minimum operation voltage during the deep-sleep mode and then rises back to the normal operation voltage, the power-on-reset device 120 resets the logic states in the memory controller 130 to make sure the states in the memory controller 130 being correct.

For example, the first threshold is 1.3V, and the second threshold and the minimum operation voltage of the memory controller 130 is 1.6V. If the external supply voltage EXVDD falls to 1.4V, which is less than the 1.6V minimum operation voltage when the memory controller 130 operates in the deep-sleep mode, some logic levels latched by some latch circuits in the memory controller 130 become to be floating.

When the external supply voltage EXVDD rises back to the normal operation voltage and the memory controller 130 returns to the standby mode, some control parameters in the memory controller 130 may be lost. Therefore, the reset threshold is raised from the first threshold 1.3V to the second threshold 1.6V to make sure that the memory controller 130 can operate correctly back in the standby mode.

Figure 2:
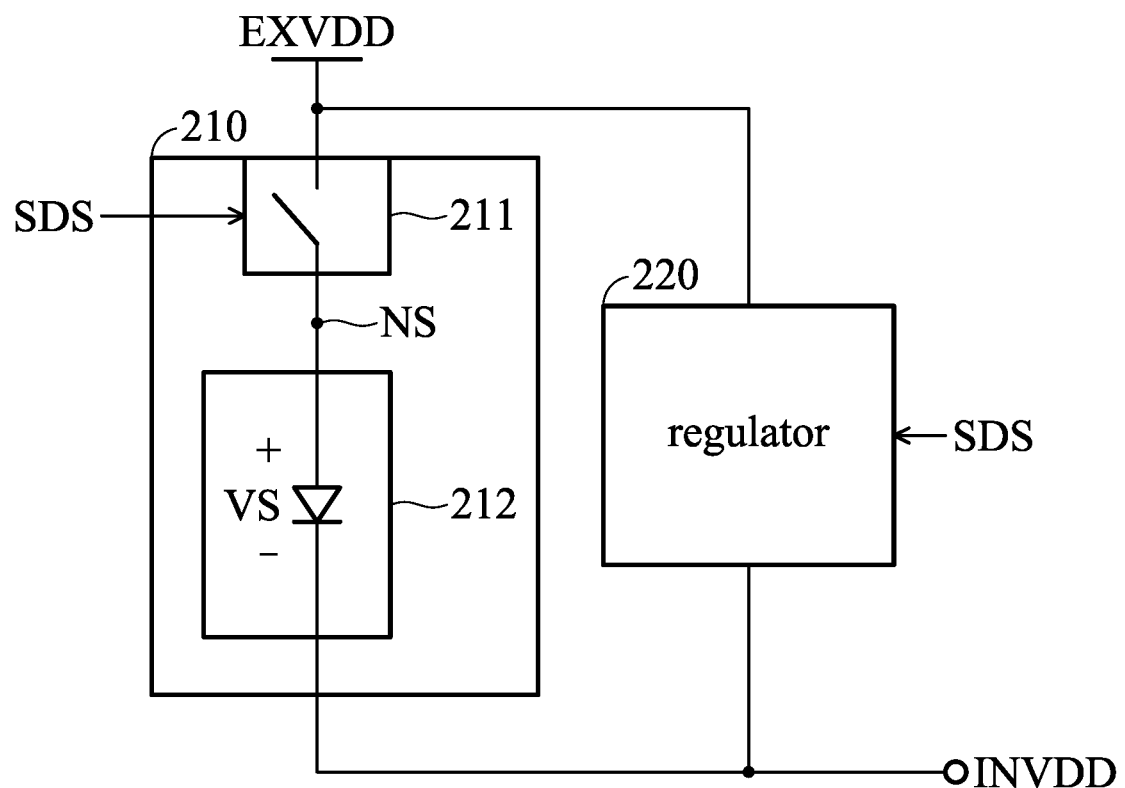
FIG. 2 is a block diagram of a power supply device in accordance with an embodiment of the invention.

As shown in FIG. 1, the power supply device 110 executes the corresponding operations according to the deep-sleep signal SDS. The operations of the memory controller 130 during the standby mode and the power supply device 110 during the deep-sleep mode will be described in the following paragraphs. FIG. 2 is a block diagram of a power supply device in accordance with an embodiment of the invention. As shown in FIG. 2, the power supply device 200 includes a power clamp 210 and a regulator 220.

According to an embodiment of the invention, when the memory controller 130 operates in the deep-sleep mode, the power clamp 210 is configured to convert the external supply voltage EXVDD into the internal supply voltage INVDD for lowering power consumption.

According to another embodiment of the invention, when the memory controller 130 operates in the standby mode, the regulator 220 is configured to convert the external supply voltage EXVDD into the internal supply voltage INVDD to stabilize the internal supply voltage INVDD for the best performance of the memory controller 130 and the memory array 140 in FIG. 1.

As shown in FIG. 2, the power clamp 210 includes a power switch 211 and a unidirectional conducting device 212. The power switch 211 is coupled between the external supply voltage EXVDD and the power node NS. When the memory controller 130 in FIG. 1 operates in the deep-sleep mode, the power switch 211 provides the external supply voltage EXVDD to the power node NS according to the deep-sleep signal SDS.

The unidirectional conducting device 212 is coupled between the power node NS and the internal supply voltage INVDD, which has a forward voltage VS. When the memory controller 130 in FIG. 1 operates in the deep-sleep mode, the unidirectional conducting device 212 generates the internal supply voltage INVDD according to the external supply voltage EXVDD, in which the difference between the external supply voltage EXVDD and the internal supply voltage INVDD is the forward voltage VS. In other words, the internal supply voltage INVDD is the external supply voltage EXVDD subtracted by the forward voltage VS.

According to an embodiment of the invention, the unidirectional conducting device 212 is a diode, in which the forward voltage VS is the forward voltage of a diode. According to another embodiment of the invention, the unidirectional conducting device 212 is a diode-connected transistor such as a P-type transistor with the gate terminal coupled to the drain terminal, in which the forward voltage VS is a voltage between the source terminal and the gate terminal of a diode-connected transistor.

According to an embodiment of the invention, when the memory controller 130 in FIG. 1 operates in the deep-sleep mode, the regulator 220 stops operating according to the deep-sleep mode SDS, and the power clamp 210 generates the internal supply voltage INVDD to maximally reduce power consumption.

According to an embodiment of the invention, the regulator 220 is a linear regulator, which is configured to down-convert the external supply voltage EXVDD and to provide the stable internal supply voltage INVDD. According to another embodiment of the invention, the regulator 220 is a nonlinear regulator to reduce the power consumption in the standby mode for improving the power efficiency. According to other embodiments of the invention, the regulator 220 may be any known or unknown down-converting regulator.

Figure 3:
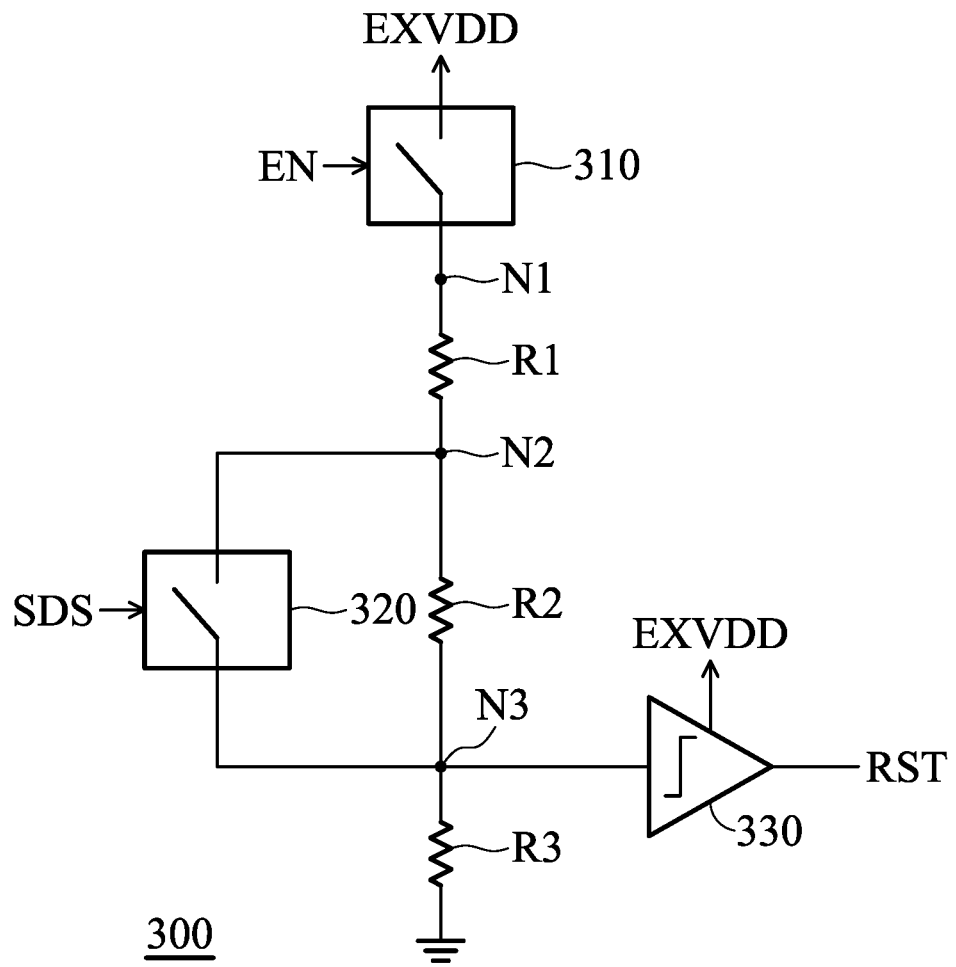
FIG. 3 is a schematic diagram of a power-on-reset device in accordance with an embodiment of the invention.

FIG. 3 is a schematic diagram of a power-on-reset device in accordance with an embodiment of the invention. As shown in FIG. 3, the power-on-reset device 300 includes a first switch 310, a first resistance R1, the second resistance R2, the third resistance R3, the second switch 320, and a hysteresis trigger 330.

The first switch 310 provides the external supply voltage EXVDD to the first node N1 according to the enable signal EN, in which the memory device 100 in FIG. 1 is activated according to the enable signal EN. According to an embodiment of the invention, the first switch 310 is a P-type transistor. The first resistor R1 is coupled between the first node N1 and the second node N2, the second resistor R2 is coupled between the second node N2 and the third node N3, and the third resistor R3 is coupled between the third node N3 and the ground.

The second switch 320 couples the second node N2 to the third node N3 according to the deep-sleep signal SDS. According to an embodiment of the invention, the second switch 320 is an N-type transistor. According to another embodiment of the invention, the second switch 320 is a P-type transistor.

The hysteresis trigger 330 is supplied with the external supply voltage EXVDD. When the voltage of the third node N3 is less than the reset threshold of the hysteresis trigger 330, the hysteresis trigger 330 generates the reset signal RST. According to an embodiment of the invention, the memory controller 130 in FIG. 1 resets all the internal registers inside according to the reset signal RST.

According to an embodiment of the invention, when the memory controller 130 in FIG. 1 operates in the standby mode, the second switch 320 is turned ON according to the deep-sleep signal SDS such that the external supply voltage EXVDD is divided by the first resistor R1 and the third resistor R3. When the voltage of the third node N3 is rising to reach the reset threshold of the hysteresis trigger 330, the hysteresis trigger 330 generates the reset signal RST.

According to another embodiment of the invention, when the memory controller 130 in FIG. 1 operates in the deep-sleep mode, the second switch 320 is turned OFF according to the deep-sleep signal SDS such that the external supply voltage EXVDD is divided by the first resistor R1, the second resistor R2, and the third resistor R3. When the voltage of the third node N3 is rising to reach the reset threshold of the hysteresis trigger 330, the hysteresis trigger 330 generates the reset signal RST.

Since the external supply voltage EXVDD is divided by the first resistor R1, the second resistor R2, and the third resistor R3 during the deep-sleep mode, it indicates that the voltage value of the external supply voltage EXVDD triggering the reset signal RST in the deep-sleep mode exceeds that in the standby mode. Therefore, the reset threshold of the power-on-reset device 300 can be adjusted by controlling the second switch 320 to be turned ON or OFF.

Figure 4:
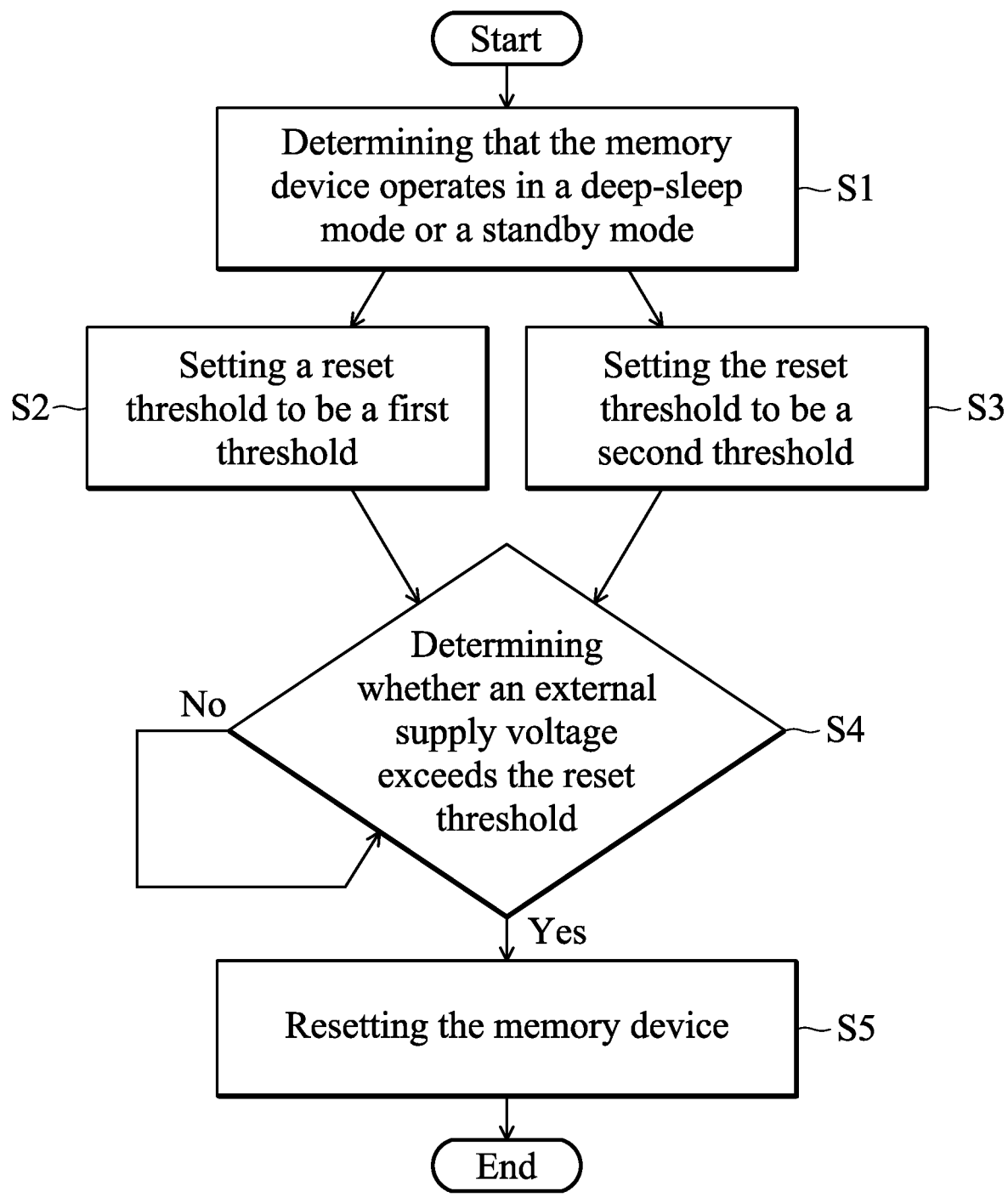
FIG. 4 is a flow chart of a control method in accordance with an embodiment of the invention.

FIG. 4 is a flow chart of a control method in accordance with an embodiment of the invention. The following description about FIG. 4 will be accompanied with FIG. 1 for the simplicity of explanation.

As shown in FIG. 4, the memory controller 130 of the memory device 100 in FIG. 1 is determined to be in the deep-sleep mode or the standby mode (Step S1). When the memory device 100 is determined to be in the standby mode, the reset threshold of the power-on-reset device 120 in FIG. 1 is set to the first threshold (Step S2). When the memory device 100 is determined to be in the deep-sleep mode, the reset threshold of the power-on-reset device 120 is set to be the second threshold (Step S3), in which the second threshold exceeds the first threshold.

Then, the external supply voltage EXVDD is detected by the power-on-reset device 120 to determine whether the external supply voltage EXVDD exceeds the reset threshold (Step S4). When the external supply voltage EXVDD exceeds the reset threshold, the memory device 100 is reset (Step S5). When the external supply voltage EXVDD does not exceed the reset threshold, Step S4 is re-executed to detect the external supply voltage EXVDD.

According to an embodiment of the invention, the power-on-reset device 120 in FIG. 1 generates the reset signal RST based on whether the external supply voltage EXVDD exceeds the reset threshold, in which the memory controller 130 resets its internal logic levels based on the rising edge or the falling edge of the reset signal RST.

According to an embodiment of the invention, as shown in FIG. 3, when it is in the standby mode, the second switch 320 is turned ON, and the voltage value of the external supply voltage EXVDD, which triggers the hysteresis trigger 330 to generate the reset signal RST, is the first threshold. According to another embodiment of the invention, when it is in the deep-sleep mode, the second switch 320 is turned OFF, and the voltage value of the external supply voltage EXVDD, which triggers the hysteresis trigger 330 to generate the reset signal RST, is the second threshold.

Memory devices and control methods are provided in the invention. The reset threshold of the memory device is raised to make sure that the memory device can operate normally from the deep-sleep mode back to the standby mode, and the recovery speed from the deep-sleep mode back to the standby mode is therefore improved.

What is claimed is:

1. A memory device, comprising:
   a power supply device, converting an external supply voltage into an internal supply voltage;
   a power-on-reset device, generating a reset signal upon detecting that the external supply voltage exceeds a first threshold, wherein the power-on-reset device raises the first threshold to a second threshold according to a deep-sleep signal, wherein the power-on-reset device comprises:
- a first switch, providing the external supply voltage to a first node according to an enable signal, wherein the memory device is activated by the enable signal;
- a first resistor, coupled between the first node and a second node;
- a second resistor, coupled between the second node and a third node;
- a third resistor, coupled between the third node and a ground;
- a second switch, coupling the second node to the third node according to the deep-sleep signal; and
- a hysteresis trigger, generating the reset signal when a voltage of the third node is not less than a reset threshold;

a memory array, supplied with the internal supply voltage; and a memory controller, supplied with the internal supply voltage, accessing the memory array, and being reset according to the reset signal, wherein when the memory controller operates in a deep-sleep mode, the memory controller generates the deep-sleep signal.

2. The memory device of claim 1, wherein the second threshold is a minimum operation voltage of the memory controller, wherein the first threshold is less than the minimum operation voltage.

3. The memory device of claim 1, wherein the power supply device comprises:
- a power clamp, lowering the external supply voltage by a voltage to reach the internal supply voltage.

4. The memory device of claim 3, wherein the power clamp comprises:
- a power switch, providing the external supply voltage to a power node according to the deep-sleep signal; and
- a unidirectional conducting device, coupled between the power node and the internal supply voltage and comprising a forward voltage, wherein a difference between the external supply voltage and the internal supply voltage is equal to the forward voltage.

5. The memory device of claim 3, wherein the power supply device comprises:
- a regulator, converting the external supply voltage into the internal supply voltage according to a standby signal and stabilizing the internal supply voltage, wherein when the memory controller operates in a standby mode, the memory controller generates the standby signal.

6. The memory device of claim 1, wherein when the memory controller operates in the deep-sleep mode, the second switch is turned OFF, and when the memory controller operates in the standby mode, the second switch is turned ON.

7. A control method for a memory device, comprising:
determining whether the memory device is operating in a deep-sleep mode or a standby mode;
when the memory device is operating in the standby mode, setting a reset threshold to be a first threshold;
when the memory device is operating in the deep-sleep mode, setting the reset threshold to be a second threshold, wherein the second threshold exceeds the first threshold;
determining whether an external supply voltage exceeds the reset threshold, wherein the step of determining whether the external supply voltage exceeds the reset threshold comprises:
- providing the external supply voltage to a first node according to an enable signal by using a first switch, wherein the memory device is activated by the enable signal;
- coupling the first node to a second node by a first resistor;
- coupling the second node to a third node by a second resistor;
- coupling the third node to a ground by a third resistor;
- coupling the second node to the third node according to the deep-sleep signal by a second switch;
- generating a reset signal when a voltage of the third node is not less than a reset threshold by using a hysteresis trigger; and
- when the external supply voltage exceeds the reset threshold; and when the external supply voltage exceeds the reset threshold, resetting the memory device according to the reset signal, wherein the second threshold is a minimum operation voltage of the memory device, wherein the first threshold is less than the minimum operation voltage.

8. The control method of claim 7, wherein when the memory device is operating in the deep-sleep mode, the control method further comprises:
converting the external supply voltage into the internal supply voltage by a unidirectional conducting device, wherein a difference between the external supply voltage and the internal supply voltage is equal to a forward voltage of the unidirectional conducting device.

9. The control method of claim 7, wherein when the memory device is operating in the standby mode, the control method further comprises:
converting the external supply voltage into the internal supply voltage using a regulator; and
stabilizing the internal supply voltage.

10. The control method of claim 9, wherein the regulator is a linear regulator.

11. The control method of claim 9, wherein the regulator is a nonlinear regulator.

* * * * *